United States Patent [19]
Hatano et al.

[11] 3,950,743
[45] Apr. 13, 1976

[54] KEYING INPUT APPARATUS HAVING A REDUCED NUMBER OF OUTPUT TERMINALS

[75] Inventors: Isao Hatano, Kyoto; Akira Nagano, Nagaokakyo; Kazuaki Urasaki, Muko, all of Japan

[73] Assignee: Omron Tateisi Electronics Co., Japan

[22] Filed: Apr. 1, 1974

[21] Appl. No.: 456,817

[30] Foreign Application Priority Data
Apr. 3, 1973    Japan.............................. 48-38368

[52] U.S. Cl............. 340/336; 340/324 R; 340/365 R
[51] Int. Cl.²........................................... G09F 9/32
[58] Field of Search........... 340/324 R, 324 M, 337, 340/365 R, 365 S, 336

[56] References Cited
UNITED STATES PATENTS
3,715,746  2/1973  Hatano............................. 340/365 S
3,778,815  12/1973  Wright............................. 340/365 S

*Primary Examiner*—Marshall M. Curtis
*Attorney, Agent, or Firm*—Staas & Halsey

[57] ABSTRACT

A keying input apparatus operates as a function of two kinds of timing signals, one being of a first timing period and generally composed of a plurality of digit timing signals generated in a digit sequence and the other being of a second timing period for disabling a display device during that period, such that a plurality of pieces of information, such as the digit timing signals and/or segment selection signals for the display device, are provided from a plurality of output terminals during said first timing signal for the purpose of outputting thereof to the display device, and a plurality of different coded signals, each composed of a plurality of bits, in a bit sequence, are provided from the same said plurality of output terminals during said second timing signal, each of which output terminals is individually connected to a corresponding one of a plurality of key switches, which are commonly connected through a common terminal to a register, so that any desired coded signal, as selected by a corresponding one of said plurality of key switches, can be inputted to the register during the second timing period.

17 Claims, 10 Drawing Figures

KEYING INPUT APPARATUS HAVING A REDUCED NUMBER OF OUTPUT TERMINALS

BACKGROUND OF THE INVENTION

1. Field of the Invention

This invention relates to a keying input apparatus for any type of electronic processor and, more particularly, to such a keying input apparatus suited for a desk top type electronic calculator, an electronic cash registor, and the like including a display device.

2. Description of the Prior Art

A key board provided with a plurality of key switches is used for the desk top type electronic calcurator. Such information processing apparatus as the desk top type electronic calculator typically comprises a circuit body for storing and processing the numerical information, switching means for inputting signals for processing the numerical information, and a display device for displaying the numerical information. The conventional key board is constructed so that a given voltage is applied commonly to one end of each key switch, and each key switch is connected, at its other end, to a circuit having storage, caluculation and control functions. Terminals or pins the number of which is the same as the number of the key switches are required for the circuit. Accordingly, the number of wiring corresponding to the number of the key switches is also required. The circuit body of a typical desk top type electronic calculator uses an integrated circuit. However, in using such an integrated circuit, the cost of the desk top type electronic calculator becomes higher extremely with the increased number of the terminals or the pins, and thus with the increased number of the wirings. Therefore, it is required to minimize them.

In order to meet such requirement, it has been proposed that a timing signal is employed as a key input signal, such that the timing signal for operation of the apparatus is inputted to the circuit body through one line and thus one terminal by the key input means, the timing signal being coded using matrix means in the circuit body. However, in this type of system, the circuit construction of the matrix means itself becomes complex, and many output lines are required in deriving the output signal from the matrix means. Accordingly, according to such a system, a scale of integration of integrated circuits is lowered, which will be an obstacle to reduction of the costs.

An information input apparatus has been proposed heretofore wherein the number of the pins or terminals to be provided already in the circuit body is reduced, the circuit structure is simplified to improve the scale of integration of the integrated circuit, and thereby the cost is reduced. The information input apparatus as heretofore proposed uses, as an input signal, a timing signal which is composed of digit timing pulses each including a plurality of bit timing pulses, which are used for the numerical display and the numerical information processing of the desk top type electronic calculator. Such timing signals are generated from a timing signal generating circuit provided in the circuit body of the desk top type electronic calculator. A plurality of key switches are provided, on the key board, remotely from the circuit body and a plurality of digit timing pulses of different timing are individually applied to one end of a plurality of key switches. In the wiring thereof, the existing digit timing signal output terminals are used which are provided indispensably in the circuit body to apply the timing signals to the display device for display driving operation of the display device. The other end of each key switch is commonly connected to the circuit body by a single wiring. In other words, time-shared input signals are inputted to the circuit body by a single line. Accordingly, the number of the wires and, connection terminals is reduced remarkably as compared with that of conventional such apparatus. A coded signal generating means is provided which converts into coded signals the timing signals which are composed of bit timing pulses including a plurality of bit timing pulses. More specifically, the coded signal generating means uses the bit timing signal to generate a binary coded signal and a desired coded signal is extracted by the timing signal from the depressed key switch during the subsequent digit timing pulse period. Thus, the digit timing pulses to be inputted by the key switch are converted into coded signals for use in calculation, etc.

Thus, according to the apparatus described in the referenced patent application, the bit timing pulses included in the digit timing signal are used to synchronously generate the coded signal corresponding to the digit timing pulse. Accordingly, the circuit construction is comparatively simplified. Also, the number of the output signal lines at which the coded signal is derived may be unity, whereby the degree to which the circuits may be integrated is increased substantially as compared with systems employing matrix means. Accordingly, a large cost decrease is possible.

However, the apparatus described in the referenced patent application has the following disadvantages. Namely, in a case where the number of key switches is less than that of the digit timing pulses of the timing signal, no problem arises, while in a reverse case, the key switches have to be divided into a plurality of groups. Therefore, two or more common input signal lines and common connection terminals from the key switches are required. Since the number of digit timing pulses of the timing signal is normally selected to be a value related to the digit number of the display device, the number of digit timing pulses can not be more than necessary. Accordingly, if number of the key switches can be increased without increasing number of the digit timing pulses, and the number of terminals provided in the circuit body, it is highly desirable in reducing the cost of the information processing apparatus such as a desk top electronic calculator. The other disadvantage with the invention disclosed in the refrenced patent application is that information identification errors are liable to be caused when the information input signals to be inputted successively are in rapid succession in terms of digit timing, since the information signal inputs are sent in series by a single line.

SUMMARY OF THE INVENTION

Briefly described, this invention comprises a keying input apparatus which is usable with an electronic processing system and comprises means for generating two kinds of timing signals, one being of a first timing period during which a plurality of pieces of information are provided for the purpose of operation of the system, such as processing, displaying and the like, and the other being of a second timing period during which any desired coded signal composed of a predetermined combination of a plurality of bit timing pulses is obtained, for the purpose of key inputting as a function of selection of a key input means out of a plurality of key input means. A plurality of such key input means are provided, individually corresponding to the coded signals, each having one terminal coupled to the corresponding coded signal and having the other terminal coupled commonly to an electronic circuit for decoding the coded signal as inputted. Typically, the said plurality of pieces of information comprises a plurality of digit timing pulses and/or numeral selection signals to be used in a dynamic type display apparatus and the coded signals are withdrawn through output terminals that are used for additionally outputting the digit timing pulses and/or numeral selection signals to corresponding, individual terminals of the key input means.

Therefore, it is an object of this invention to provide an improved keying input apparatus for electronic processing system.

It is another object of this invention is to provide a keying input apparatus wherein the number of terminals and wires is reduced.

It is still a further object of this invention to provide a keying input apparatus which is relatively economical and simple to fabricate.

Other objects, features and advantages of this invention will become apparant as the description proceeds in connection with the accompanying drawings.

BRIEF DESCRIPTION OF THE DRAWINGS

In the figures, like reference characters refer to like parts.

DESCRIPTION OF THE PREFERRED EMBODIMENTS

Figure 1:
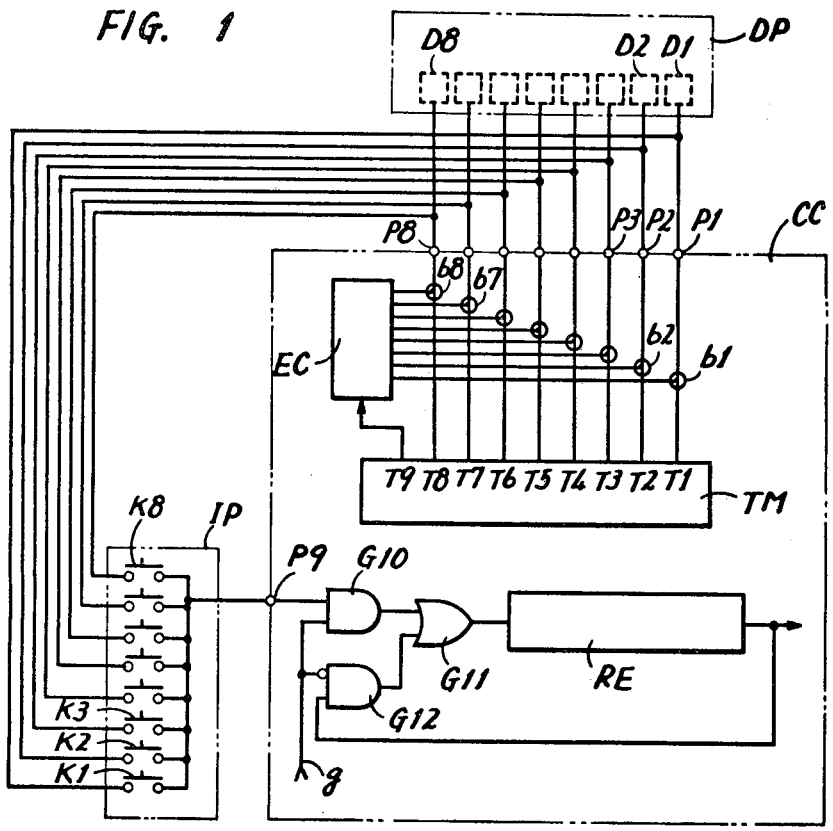
FIG. 1 shows a schematic diagram of an embodiment of this invention.

FIG. 1 is a schematic diagram of one embodiment of a keying input apparatus in accordance with this invention. The key input apparatus comprises a circuit body CC including a digit timing signal generator TM, an information processing circuit (not shown), etc., an information input means IP such as a key switch board for inputting the information thereto, and a display device DP for displaying the information processed in the circuit body CC. The display device DP includes eight digit display positions, (not shown) each digit display position being enabled for display by dynamic driving operation, through its corresponding digit driving circuits D1, D2, . . . , D8. The digit timing signals T1, T2, . . . , T8 are supplied from display information signal output terminals P1, P2, . . . , P8, which are provided in the circuit body CC, to the digit driving circuits D1, D2, . . . , D8 of the display device DP. The input means IP includes key switches K1, K2, . . . , K8 and corresponding first ends of the key switches K1, K2, . . . , K8 are commonly connected to the input terminal P9 of the circuit body CC. The other ends of the key switches K1 to K8 are connected to the output terminals P1 to P8, respectively, of the circuit body CC.

According to this invention, the digit timing signal generator TM generates timing pulses T1 to T9 sequentially. The pulse T9 is inputted to an encoder EC. The encoder EC supplies eight different coded signals to the output terminals P1 to P8 simultaneously during the generating period of the pulse T9, namely, during the period corresponding to the pulse width thereof. Each such coded signal is sent in bit sequence, and at the rate of the bit timing signals, to a corresponding one of the output terminals P1 to P8.

Figure 1A:
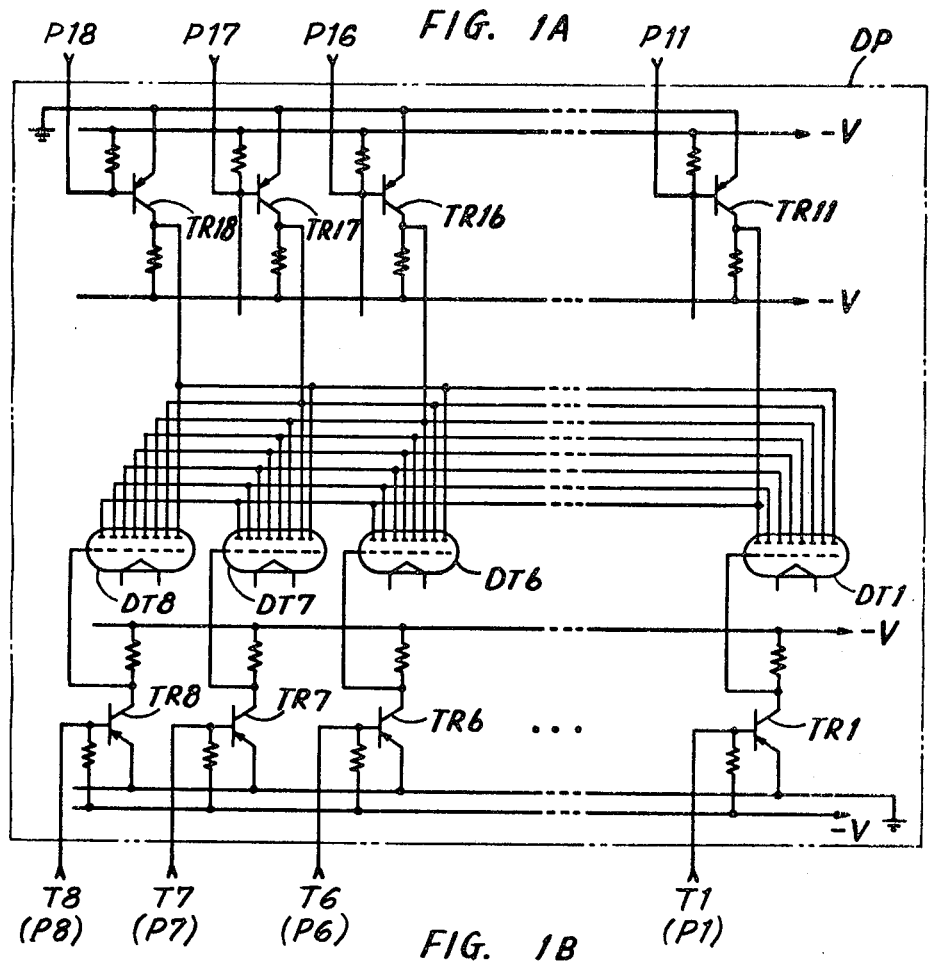
FIG. 1A shows in greater detail the display device DP of FIG. 1.

Referring to FIG. 1A, the display device DP is shown in greater detail. The digit timing signals T1 to T8 from the terminals P1 to P8 are inverted and coupled to the bases of transistors TR1 to TR8 serving as display drivers D1 to D8, respectively. Transistors TR11 to TR18 are used to drive 8 segments arrayed in a figure "8" pattern in a well known manner in each gas discharge tube DT1 to DT8, and have their bases coupled through lines (not shown) to the circuit body CC to control their conduction. More specifically, each of the gas discharge tubes DT1 to DT8 has 8 segmented electrodes shown as anodes and a common electrode shown as the associated with the segmented electrodes, and corresponding segmented electrodes of the different gas discharge tubes are interconnected. The segment select signals P11 to P18 may be provided by a circuit as explained in relation to FIG. 3.

Figure 5:
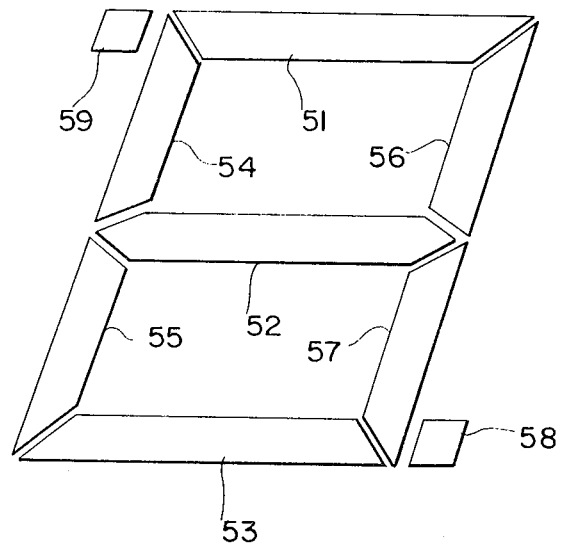
FIG. 5 is an illustration of a conventional nine-segment display.
Figure 6:
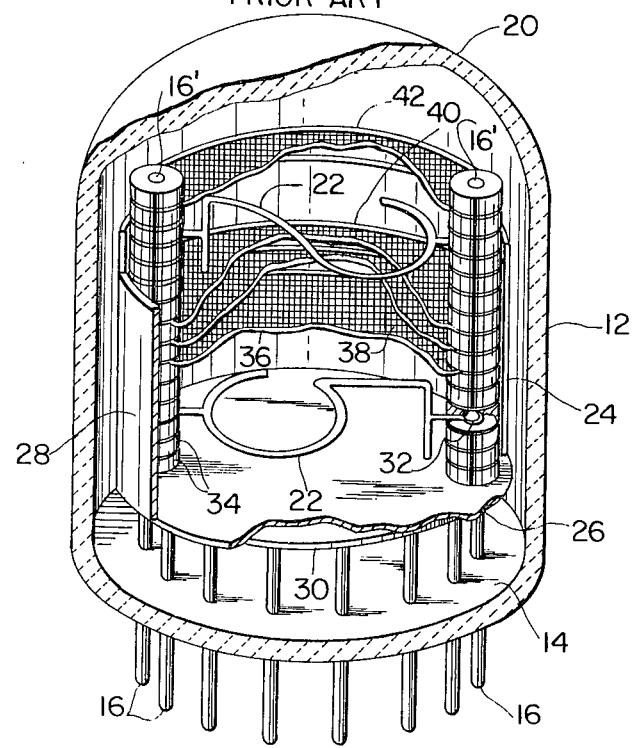
FIG. 6 is an illustration of a conventional display tube having individual electrodes, or segments, each of which corresponds to a given numerical character of the group 1 to 9 and 0.

The segmented electrodes are shown in a conventional configuration in FIG. 5, in which segmented electrodes S1 to S7 are arranged in the well known 7-segment font; an eighth electrode S8 provides a decimal point. As will be explained with reference to the circuit of FIG. 3, a ninth electrode S9 may be provided to form an apostrophe. Any one or more of the segmented electrodes may be selectively energized for display of a desired one of the numerals 1 to 9 and 0 and/or of a decimal point and/or of an apostrophe, in a manner well known in the art.

Figure 1B:
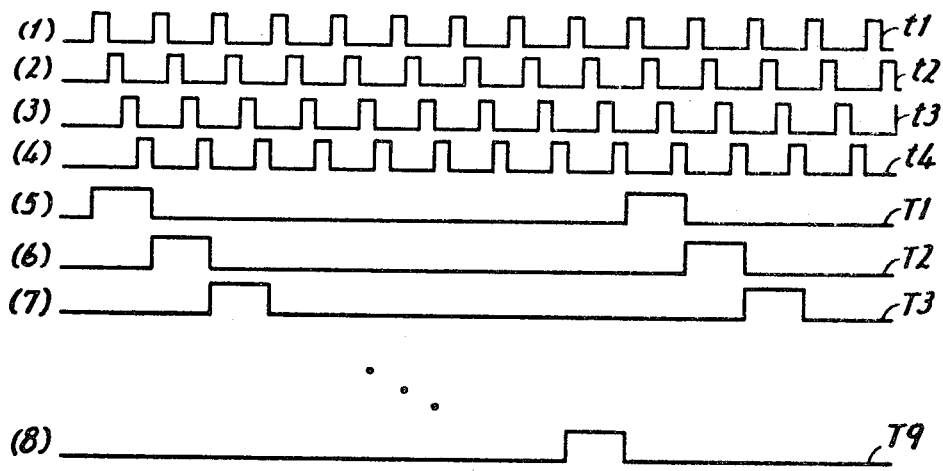
FIG. 1B shows a timing format of pulses used in the FIG. 1 embodiment.

Referring to FIG. 1B, there is shown a timing format of pulses used in the FIG. 1 embodiment. The digit timing signals T1 to T9 as shown in FIG. 1B (5) to (8), respectively, are generated by the generator TM of the FIG. 1 embodiment, each being composed of 4 bit timing signals $t1$ to $t4$ as shown in FIG. 1B (1) to (4), respectively.

Figure 2:
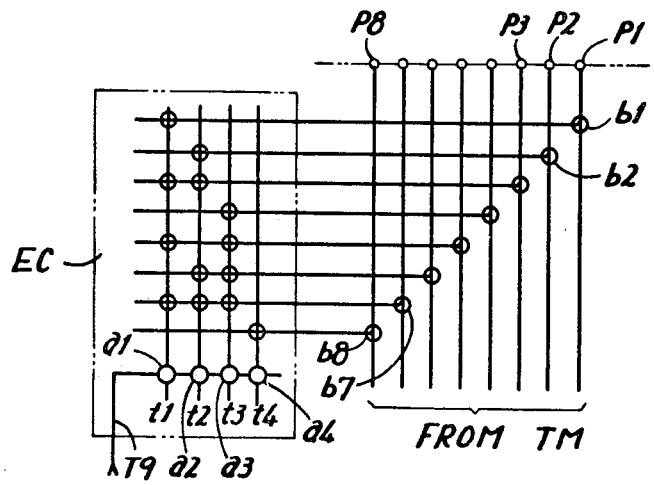
FIG. 2 shows in detail a circuit diagram of the encoder EC in FIG. 1 embodiment.

Referring to FIG. 2, there is shown an electric circuit for the encoder EC in more detail. In the encoder EC, four bit pulses $t1$ to $t4$ are generated sequentially by a bit pulse generating circuit (not shown) during the generating period of the pulse T9. The output of the encoder EC is weighted by bit pulses $t1$ to $t4$, in a manner to be described more fully hereinafter. Elements $a1$ to $a4$ each function as a NAND gate. Elements $b1$ to $b8$ perform, the function of an OR gate. The bit pulses $t1$ to $t4$ are applied to column signal lines of the encoder EC. Row signal lines are connected respectively to the output terminals P1 to P8 through the elements $b1$ to $b8$. In order to achieve a binary coded decimal code, MOS elements or field effect transistors are provided properly in the intersections of the column signal lines and the row signal lines, and are represented by circles in the figure. Thus, only at the generation of the pulse T9, the binary coded decimal code "1000" is sent in a bit sequence to the output terminal P1. Also, codes "0100", "1100" etc. are sent in bit sequence and simultaneously, during T9, to the corresponding output terminals P2, P3, etc.

Figure 2A:
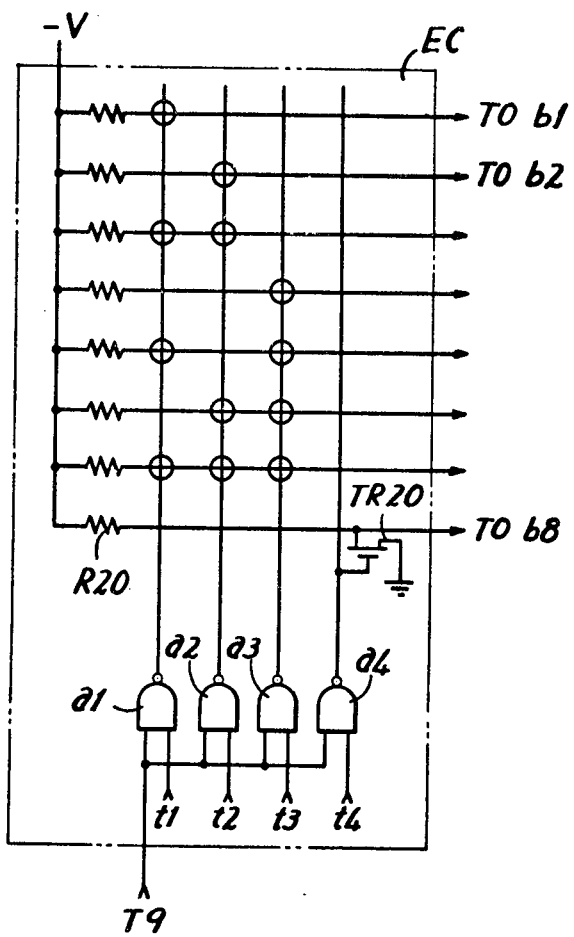
FIG. 2A shows in greater detail a circuit diagram of the encoder EC in FIG. 2 embodiment.

FIG. 2A shows the encoder EC in greater detail. A transistor TR20 is one of the field effect transistors represented by circles at the intersections, which has its gate electrode coupled through the column signal line to the output of the NAND gate $a4$, and has its source electrode and its drain electrode interposed in electrical series between the ground and the row signal line which is connected via a resistor R20 to a voltage source $-V$. The remaining field effect transistors are connected in the similar manner.

Figure 2B:
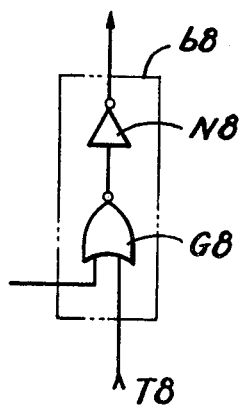
FIG. 2B shows in greater detail the element b8 in FIG. 2.

FIG. 2B shows the element $b8$ in FIG. 2 in greater detail. The element $b8$ is implemented by a NOR gate G8 and an inverter N8 for inverting the output of the NOR gate G8. The NOR gate G8 has one input terminal coupled to the digit timing signal T8 and has the other input terminal coupled to the row signal line. The remaining elements $b1-b7$ are implemented in the similar manner.

Referring again to FIG. 1, the coded signal corresponding to the depressed key switch is applied from the input terminal P9 through an AND gate G10 and an OR gate G11 to a registor RE. The coded signal stored in the register RE circulates through a closed loop including the OR gate G11 and a gate G12, and is used for any desired purpose in the desk top electronic calculator. During an operation mode for keying inputs, a signal $g$ which is generated in the circuit body CC enables the AND gate G10 and disables the gate G12, and thus the coded signal from the input terminal P9 can be stored in the register RE. During operation modes other than the keying input, the signal $g$ disables the AND gate G10, and thus the coded signal from the input terminal P9 cannot be applied to the register RE, whereas the signal $g$ enables the gate G12, and thus the coded signal previously applied remains to be stored in the register RE.

The timing signals T1, T2, . . . , T8 are used for the dynamic display operation of the display device DP. On the other hand, the timing signal T9 is not used for the display operation, but instead is used for carry operations, or for addition and subtraction, memory, etc. Accordingly, the output terminals P1, P2, . . . , P8 and timing signals T1, T2, . . . , T9 are indispensable in the usual calculator. Since this invention uses the existing output terminals and the timing signals which are indispensably provided, it is understood that it is not necessary that any more terminals be provided in the circuit body CC beyond those conventionally provided, to enable use of this invention.

Since the circuit is constructed as described hereinabove, the digit position display driving circuits D1 to D8 are energized, or enabled, during the period in which the corresponding timing pulses T1 to T8 are sequentially generated. At the time of generation of the timing pulse T9, however, the bit sequential coded signals are supplied simultaneously to numerical keys K1 to K8. At that time, by depressing one of numerical keys K1 to K8 e.g. the key K2, a bit sequential code signal 0100 corresponding thereto is stored in the register RE through the input terminal P9 and the gates G10 and G11.

Figure 3:
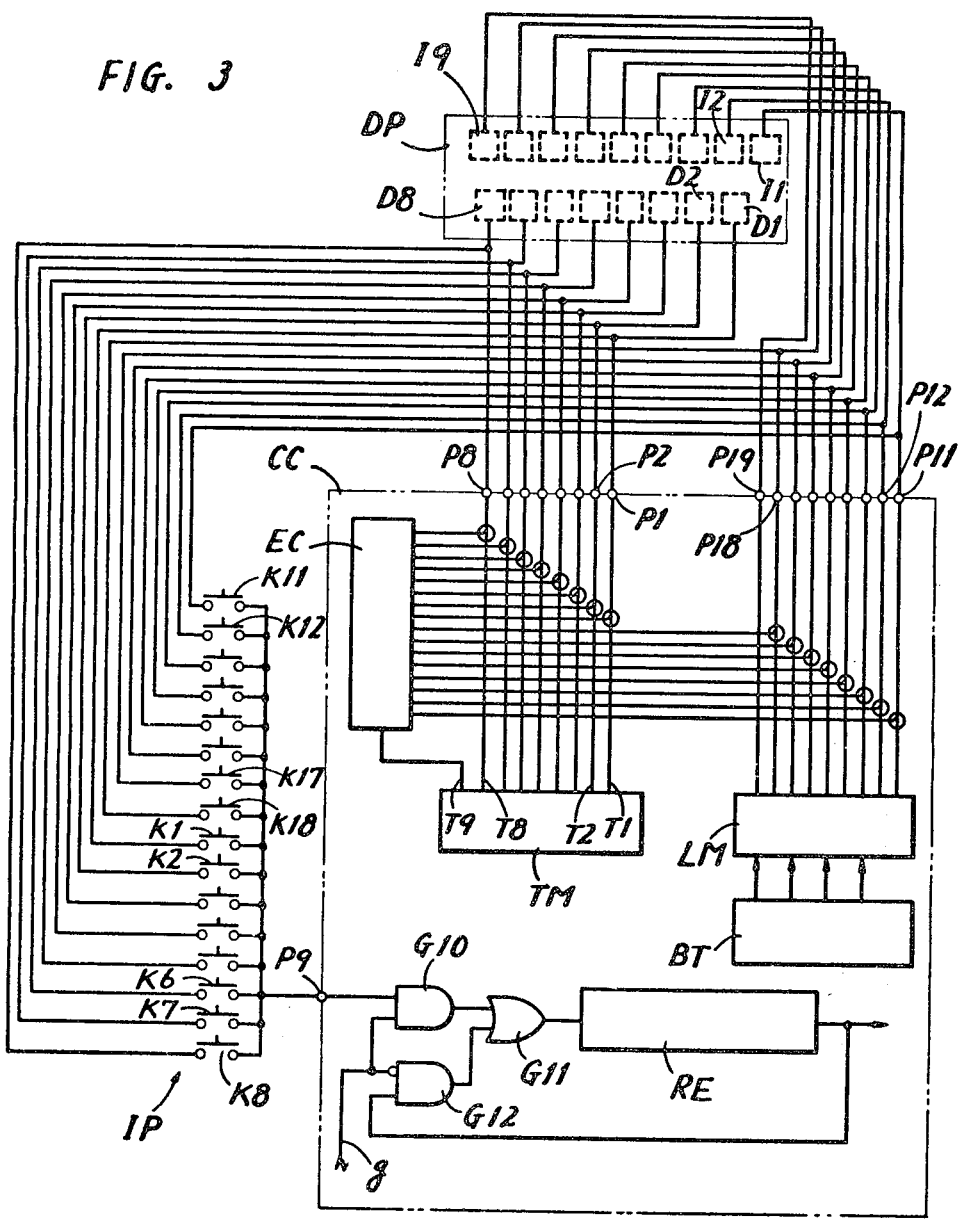
FIG. 3 shows a schematic diagram of an alternative embodiment of this invention.

In the embodiment explained with reference to FIGS. 1 to 2B, the number of the digit timing pulses T1 to T8 was the same as that of the numerical keys K1 to K8. The number of the numerical keys may be increased to input the other information, as required. Referring to FIG. 3, a further embodiment of this invention where such a problem is solved is shown.

Figure 4:
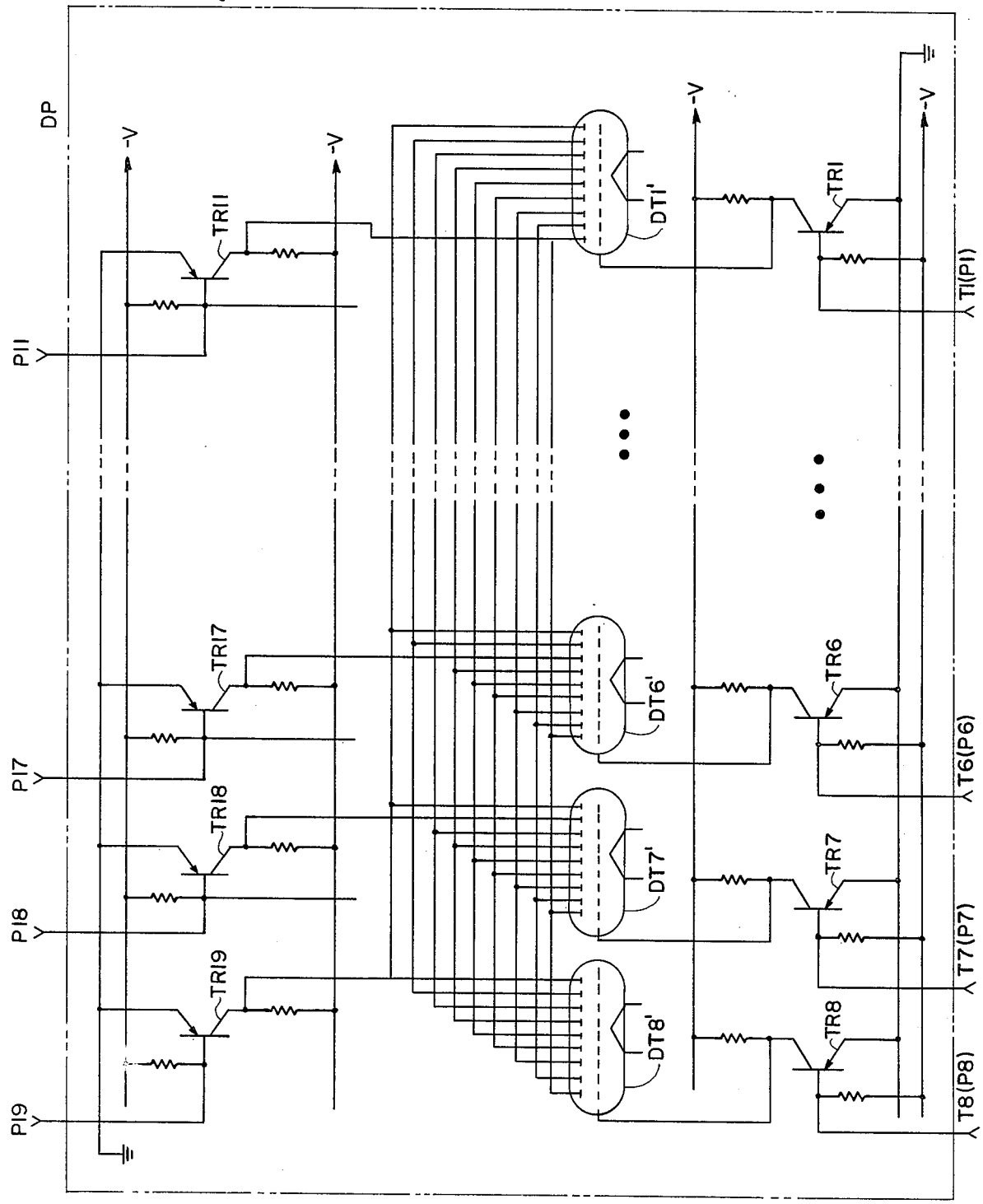
FIG. 4 shows in greater detail the display device DP of FIG. 3.

The embodiment of FIG. 3 includes sixteen input key switches K1 to K8 and K11 to K18 as the input device IP. The interconnection between keys K1 to K8, a digit timing signal generator TM, digit display driving circuits D1 to D8, and the encoder EC is substantially the same as that of the embodiment of FIGS. 1 and 2. FIG. 4 is a schematic of drive and display circuits for use with the circuit of FIG. 3, essentially identical to that of FIG. 1A, but wherein each of the discharge tubes DT1' to DT8' includes nine segments and there are nine transistors TR11 to TR19, as compared to FIG. 1A wherein each of the tubes DT1 to DT8 includes eight segments and there are provided eight transistors TR11 to TR18. In FIG. 3, the numerical information signal output terminals P11 to P19 are connected to the bases of the transistors TR11 to TR19 serving as segment drivers I1 to I9 in the display device DP, and terminals P11 to P18 also are connected to the keys K11 to K18 respectively. The numerical information signals are segment select signals to be applied to the bases of the transistors TR11 to TR19 (see similar connection of terminals P11 to P18 to transistors TR11 to TR18 in FIG. 1A) for activating segments which are arrayed in a figure 8 pattern in a well known manner in each gas discharge tube DT1' to DT8' as described previously. Alternatively, the segments may be implemented with liquid crystals, light emission diodes, or the like. In case where the display device DP comprises alternative gas discharge tubes such as Nixie tubes each of which has 10 display elements or electrodes shaped in different figure 0, 1, 2, . . . , 9 patterns and has a common electrode associated with the 10 elements, the numerical information signals may be signals for selectively activating the display elements. The numerical information signals are generated by a numerical information signal generating circuit LM corresponding to each digit timing signal T1 to T8, and are introduced through terminals P11 to P19 into, for example, segment driving circuits I1 to I9 for the display device DP. The numerical information signal generating circuit LM is responsive to the 4 bit parallel coded signals which are generated by a generator BT. Generator BT may comprise an output from a suitable memory device storing the information to be displayed in accordance with a serial 4 bit format and serves to supply those serial four bits in a parallel four bit format to the circuit LM which then decodes the 4 bits to provide a corresponding one of 16 possible information signals which may include any of the digits 1 through 9 and 0, an apostrophe, a decimal point, or other display information signals. Terminals P11 to P19 are each connected to one end of the keys K11 to K18. The other end of all the key switches is connected to the input terminal P9 of the circuit body CC.

In the circuit body CC, the encoder EC sends mutually different bit sequential binary coded decimal signals to the output terminals P1 to P8 and P11 to P19 at the time of generation of the timing pulse T9. The encoder EC is provided with four timing bits $t1$ to $t4$ as shown in FIG. 2. Accordingly, 16 mutually different coded signals, and thus 16 key inputs are available. If much more keys are necessary, all that is necessary is to increase the timing bits of the encoder EC to five or more. Such variation is known to the persons skilled in the art.

In the operation of the FIG. 3 embodiment, the numerical information signal is generated from the circuit LM to produce the numeral shape corresponding to each coded digit at the sequential generation of the digit timing pulses T1 to T8. The timing pulse T9 is generated after generation of the timing pulses T1 to T8, and at that time the encoder EC simultaneously supplies each of the 4 bit sequential binary coded decimal signals to the corresponding output terminals P1 to P8 and P11 to P18. Accordingly, if a key switch is in a depressed position at the time of generation of the timing pulse T9, a corresponding coded signal is stored in the register RE through the terminal P9. However, the numerical information signal generating circuit LM and the digit timing pulse generating circuit TM are in an inoperative condition or a disabled condition upon generation of the timing pulse T9, and thus the display device DP is not enabled. Also, the display device DP is not enabled, or disabled, by the coded signal from the encoder EC.

In another embodiment of this invention, it is not necessarily required that the digit timing pulses T1 to T8 are generated on a time-sharing basis or sequentially. For example, timing pulses T1 to T8 may be generated simultaneously, and subsequently the timing pulse T9 may be generated. However, the timing pulses T1 to T8 and the timing pulse T9 should be generated at different times. In such an instance, of course, parallel sets of output terminals must be provided for the information signal inputs to the individual, respectively corresponding digit display positions. Nevertheless, the features of the invention of using at least some of these output terminals in association both with the input keys and the encoder EC and with the further output information function as illustrated for use with the display device DP, still remains.

In a further embodiment of this invention, in the FIG. 3 embodiment where the number of the input keys is small, the keys K1 to K8 connected to the output terminals P1 to P8 may be removed, and only the keys K11 to K18, connected to the output terminals P11 to P19, may be used, as shown.

This invention is implemented by time-separating the timing pulse group (T1 to T8) for displaying operation, and the key input timing pulse T9. Accordingly, in order to perform a so-called zero suppression where unnecessary zero display on the display device DP is suppressed, a gate is interposed between the digit timing pulse generating circuit TM and the output terminals P1 to P8. The gate is disabled in response to a required digit to suppress the unnecessary zero display among the numerical information given to segment driving circuits I1 or I9 at generation of the timing pulses T1 to T8. Accordingly, the zero suppression on the display device DP is employed readily in the embodiments of this invention.

As described hereinabove this invention can use the existing information signal terminals provided indispensably in the circuit body as terminals for these input signals by the use of timing signals during the display disabled timing period as the input signal source for the signal input means. Accordingly, it is not necessary that additional terminals be provided. Therefore, an economical keying input apparatus can be provided. The coded signal is supplied to, for example, the corresponding key switch particularly included in the signal input means. Thus, the processing operation of the input signal from the key switch is performed readily.

From the foregoing description it is understood that the inventive keying input apparatus operates as a function of two kinds of timing signals, one being of a first timing period and the other being of a second timing period, such that a plurality of pieces of information are provided from a plurality of output terminals during said first timing signal for the purpose of outputting thereof, such as displaying, and a plurality of different coded signals, each composed of a plurality of bits, in a bit sequence, are provided from said plurality of output terminals during said second timing signal, each of which is individually connected to a corresponding one of a plurality of keying input means, which are commonly connected through a common terminal to an electronic circuit, such as a register, so that any desired coded signal, as selected by a corresponding one of said plurality of keying input means, can be inputted to the electronic circuit during the second timing period. With reference to the FIGS. 1 and 3 embodiments, it is to be pointed out that the first timing signal is generally composed of the digit timing signals T1 to T8 and the second timing signal is composed of the timing signal T9. However, it is further to be pointed out that in the FIG. 1 embodiment a plurality of pieces of information are individually composed of the digit timing signals T1 to T8, whereas in the FIG. 3 embodiment a plurality of pieces of information are individually composed of the digit timing signals T1 to T8 and/or a plurality of numerical information units which are each to be displayed at the respective digit positions. The digit timing signals T1 to T8 of course provide the information of the selected digit position of display, herein illustratively selected in a time sequential manner, whereas the plurality of numerical information units comprise, illustratively, the segment selection signals produced in corresponding sequence for the respectively associated, selected digit positions. Whereas in the disclosed embodiments of the drawings and particularly, FIGS. 3 and 4, the information units (signals) are provided in a time sequential manner, i.e., the digit selection signals are synchronized with the segment selection signals, in sequence for the plurality of digit display positions, simultaneous display operations alternatively may be performed for the plurality of digit display positions, as above noted, the segment selection signals (information units) of course being correspondingly provided simultaneously and selectively to the appropriate display elements at each display position.

Although this invention has been described and illustrated in detail, it is to be clearly understood that the same is by way of illustration and example only and is not to be taken by way of limitation, the spirit and scope of this invention being limited only by the terms of the appended claims.

What is claimed is:
1. A keying input apparatus comprising:
means for displaying information selectively at each of a plurality of display positions,
means for providing a first timing signal in a first timing period and a second timing signal in a second timing period, said first timing signal comprising a plurality of individual display position select signals generated in time sequence for individually defining each of said display positions in said information displaying means, means for providing a plurality of information signal units, each unit identifying the information to be displayed in a corresponding digit display position, in said time sequence, said information signal units each comprising a plurality of information constituent signals, a plurality of output terminals for receiving respectively associated ones of said display position select signals and said information constituent signals, from the respective providing means thereof, a common terminal, said information displaying means being responsive to said display position select signals and said information constituent signals as provided at said plurality of output terminals for displaying the information identified by said information signal units in the corresponding display positions as identified by said display position select signals in said time sequence, means responsive to said second timing signal for individually providing to at least some of said output terminals during said second timing period a plurality of different bit serial coded signals, a plurality of keying input means corresponding to said coded signals, each having one terminal connected individually to a corresponding one of said output terminals and the other terminal connected to said common terminal and operable when activated to supply the corresponding bit serial coded signals from the corresponding output terminal to said common terminal, and means connected to said common terminal of said keying input means for storing said bit serial coded signal as supplied to said common terminal as a result of operation of said keying input means.

2. A keying input apparatus in accordance with claim 1, in which said keying input means are key switches.

3. A keying input apparatus in accordance with claim 1, in which said storing means is a register.

4. A keying input apparatus in accordance with claim 1, in which each of said display positions of said information displaying means comprises a plurality of selectively activated display segments arranged in a configuration for indicating any desired numeric character in accordance with selective activation of predetermined segments, said segments being activated by said information constituent signals.

5. A keying input apparatus in accordance with claim 1, in which each of said display positions of said information displaying means, comprises a plurality of selectively activated display elements, each having a configuration of a different numeric character corresponding to selective activation of a predetermined display element, said display element being activated by said information constituent signals.

6. A keying input apparatus in accordance with claim 1, in which said coded signal providing means comprises;

means for providing a set of bit pulses sequentially, and matrix network means responsive to said set of bit pulses and said second timing period signal for providing said bit serial coded signals to said output terminals.

7. A keying input apparatus in accordance with claim 6, in which said matrix network means comprises;

column signal lines associated with said set of bit pulses and said second timing period signal, row signal lines connected to said output terminals, and connection means provided at predetermined intersections of column and row signal lines and responsive to said set of bit pulses on said column signal lines for providing at said row signal lines said bit serial coded signals, said predetermined intersections determining a bit sequential combination for uniquely defining said coded signals.

8. A keying input apparatus in accordance with claim 7, in which said connection means are transistors.

9. A keying input apparatus in accordance with claim 1, in which said timing signal generating means, said information providing means, said coded signal providing means and said electronic circuit are implemented by an integrated circuit.

10. A keying input apparatus in accordance with claim 1, in which said bit serial coded signal providing means provides said plurality of different bit serial coded signals to said output terminals to which said digit select signals are provided.

11. A keying input apparatus in accordance with claim 1, in which said bit serial coded signal providing means provides said plurality of different bit serial coded signals to said output terminals to which said information constituent signals are provided.

12. A keying input apparatus in accordance with claim 1, in which said bit serial coded signal providing means provides said plurality of different bit serial coded signals to said output terminals to which said digit select signals and said information constituent signals are provided.

13. A keying input apparatus in accordance with claim 1, which further comprises means responsive to said second timing signal for disabling said information displaying means during said second timing period.

14. A keying input apparatus comprising:

means for displaying information, said means having a plurality of display positions, a plurality of keying input means, each having first and second terminals, an integrated circuit, said circuit having a plurality of output terminals and a common terminal and electrically connected through said output terminals to said information displaying means and to said plurality of keying input means, said integrated circuit comprising:

means for providing a first timing signal in a first timing period and a second timing signal in a second timing period, said first timing signal comprising a plurality of individual display position select signals generated in a time sequence for individually defining each of said display positions in said information displaying means, means for providing a plurality of information signal units, each for selectively controlling the display in a corresponding display position, in said time sequence, said information signal units each comprising a plurality of information constituent signals, said display position select signals and said information constituent signals being supplied from said providing means thereof to corresponding ones of said plurality of output terminals, said information displaying means being responsive to said display position select signals and said information constituent signals provided at said plurality of output terminals for displaying the information defined by the information signal units in the corresponding display positions in said time sequence;

means responsive to said second timing signal for individually providing to at least some of said output terminals during said second timing period a plurality of different bit serial coded signals, respectively corresponding to said plurality of keying input means, each of said keying input means having the first terminal connected to the output terminal to which the corresponding bit serial coded signal is provided, and the second terminal connected to said common terminal and operable when actuated to supply the said corresponding bit serial coded signal from said corresponding output terminal to said common terminal, and means connected to said common terminal of said keying input means for storing said bit serial coded signals supplied thereto as a result of actuation of one of said keying input means.

15. A keying input apparatus comprising:

a plurality of keying input means each having first and second terminals;

means for defining first and second time intervals and for generating a sequence of first timing signals in said first time interval and a second timing signal in said second time interval;

a plurality of output terminals and a common terminal;

the first terminals of said plurality of keying input means being connected to respectively corresponding ones of said plurality of output terminals and the second terminal of each of said plurality of keying input means being connected to said common terminal;

means operative during said second time interval to supply a plurality of serial bit coded signals to corresponding ones of said output terminals to which said first terminals of said plurality of keying means are connected;

said keying input means being individually operable, when actuated, to supply the serial bit coded signal from the corresponding said output terminal to said common terminal;

means for storing the serial bit coded signal supplied to said common terminal during said second time interval in response to actuation of a given one of said keying input means, means for providing information signals to said plurality of output terminals in accordance with the time sequence of said timing signals of said first time interval and during said first time interval, and utilization means connected to said output terminals for utilizing said information signals supplied thereto during said first time interval, said utilization means being disabled from responding to signals at said output terminals during said second time interval.

16. Keying input apparatus as recited in claim 15 wherein said utilization means comprises display means having a plurality of individual display units, and said information providing means provides a plurality of sequential display enabling signals at the corresponding plurality of said output terminals for selectively enabling said display units in time sequence with said first timing signals.

17. Keying input apparatus as recited in claim 15 wherein each of said display units includes a plurality of selectively actuable display means for selective display of desired information, and wherein said information providing means further provides a plurality of selective information display signals to respectively corresponding ones of said output terminals for display of desired information by each of said display units, in time sequence with the enabling of each said display unit for display.

* * * * *

UNITED STATES PATENT AND TRADEMARK OFFICE
CERTIFICATE OF CORRECTION

PATENT NO. : 3,950,743
DATED : April 13, 1976
INVENTOR(S) : Isao Hatano et al

It is certified that error appears in the above-identified patent and that said Letters Patent are hereby corrected as shown below:

Column 1, line 14, change "calcurator" to --calculator--.

Column 2, line 49, change "refrenced" to --referenced--.

Column 3, line 17, delete "is" (second occurrence).

Signed and Sealed this

Tenth Day of August 1976

[SEAL]

Attest:

RUTH C. MASON
*Attesting Officer*

C. MARSHALL DANN
*Commissioner of Patents and Trademarks*